(12) United States Patent
Maeda

(10) Patent No.: US 7,193,484 B2
(45) Date of Patent: Mar. 20, 2007

(54) VOLTAGE CONTROLLED OSCILLATOR APPARATUS

(75) Inventor: Masakatsu Maeda, Mukou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 63 days.

(21) Appl. No.: 11/097,863

(22) Filed: Apr. 1, 2005

(65) Prior Publication Data

US 2005/0231295 A1    Oct. 20, 2005

(30) Foreign Application Priority Data

Apr. 14, 2004   (JP)   ............................. 2004-119425

(51) Int. Cl.
*H03B 5/12*    (2006.01)
(52) U.S. Cl. ..................... 331/117 R; 331/167; 331/46; 331/117 FE
(58) Field of Classification Search ............ 331/117 R, 331/167, 46, 117 FE
See application file for complete search history.

(56) References Cited

U.S. PATENT DOCUMENTS

| | | | |
|---|---|---|---|
| 5,446,311 A | | 8/1995 | Ewen et al. |
| 6,621,365 B1 * | | 9/2003 | Hallivuori et al. ........... 331/179 |
| 6,891,444 B2 * | | 5/2005 | Jacobsson et al. ....... 331/117 R |
| 6,911,870 B2 * | | 6/2005 | Gierkink et al. ............... 331/46 |
| 7,005,930 B1 * | | 2/2006 | Kim et al. ..................... 331/46 |
| 2005/0184820 A1 * | | 8/2005 | Hung et al. .................. 331/167 |
| 2006/0033587 A1 * | | 2/2006 | Cabanillas .............. 331/108 C |

FOREIGN PATENT DOCUMENTS

JP    8-97377    4/1996

* cited by examiner

*Primary Examiner*—Robert Pascal
*Assistant Examiner*—Levi Gannon
(74) *Attorney, Agent, or Firm*—Hamre, Schumann, Mueller & Larson, P.C.

(57) ABSTRACT

A voltage controlled oscillator apparatus includes at least two voltage controlled oscillators, each of the voltage controlled oscillators being formed on a semiconductor substrate and having an LC-resonant circuit including a three-terminal inductor or a two-terminal inductor, and a continuously variable capacitor, and an amplifier including n-channel transistors or n-channel transistors and p-channel transistors. Two of the three-terminal or two-terminal inductors constructing the first and second voltage controlled oscillators have a coil shape formed with a wiring layer of an integrated circuit formed on the semiconductor substrate, and one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape. Broadband in oscillation frequencies can be achieved while avoiding deterioration of the phase noise characteristics and enlarged chip sizes.

14 Claims, 11 Drawing Sheets

VOLTAGE CONTROLLED OSCILLATOR APPARATUS

BACKGROUND OF THE INVENTION

1. Field of the Invention

The present invention relates to a voltage controlled oscillator apparatus having voltage controlled oscillators mainly of an LC-resonant type, and particularly to a broadband version thereof.

2. Description of the Related Art

FIG. 15 is a circuit diagram of a conventional LC-resonant voltage controlled oscillator 30. This circuit includes a three-terminal inductor 31, a band-switching capacitor 32, a continuously variable capacitor 33 and n-channel transistors 34. The oscillation frequency of this voltage controlled oscillator 30 is represented by Equation (1) below.

$$f_0 = \frac{1}{2 \times \pi \sqrt{L \times C}} \quad (1)$$

Here,

C: resultant capacitance of the band-switching capacitor 32 and continuously variable capacitor 33

L: inductance of the three-terminal inductor 31

The capacitance value of the continuously variable capacitor 33 varies continuously depending on the control voltage $V_r$. In contrast, the MOS p-channel transistors $Pch_1$ and $Pch_2$ turn ON or OFF depending on whether the band control signal $V_S$ is "L" or "H", thus increasing or decreasing the capacitance value of the band-switching capacitor 32 by the amount $C_1$. This band-switching capacitor 32 is effective in implementing a voltage controlled oscillator 30 with a broadband range of oscillation frequencies, and is used typically.

The phase noise characteristics of a voltage controlled oscillator 30 with the construction described above are such that optimization of the three-terminal inductor 31, band-switching capacitor 32, continuously variable capacitor 33 and n-channel transistors 34 are related in a complex manner. Therefore, if the band-switching capacitor 32 is switched over a wide range of capacitance values, then the optimal point is shifted in the phase noise characteristics, causing the phase noise characteristics to deteriorate. In order to prevent this deterioration of the phase noise characteristics, two voltage controlled oscillators 30 with different inductance values and the like are prepared, giving a broadband range of oscillation frequencies.

FIG. 16 is a schematic plan view of two conventional three-terminal inductors formed side-by-side and used for the two voltage controlled oscillators of a voltage controlled oscillator apparatus constructed in such manner. In the figure, the three-terminal inductors 31 and 35 are each used in the construction of one of two voltage controlled oscillators that have the construction shown in FIG. 15. The three-terminal inductor 31 is connected to each of the band-switching capacitor 32, continuously variable capacitor 33 and n-channel transistors 34 of one voltage controlled oscillator 30. The three-terminal inductor 35 is connected to each of the band-switching capacitor 36, continuously variable capacitor 37 and n-channel transistors 38 of the other voltage controlled oscillator (not shown). An example of an inductor structure such as the three-terminal inductor 35 formed on a semiconductor substrate is presented in JP-H8-97377A, for example.

In addition, FIG. 17 illustrates a vertical structure wherein the MOS p-channel transistors $Pch_1$ and $Pch_2$ forming the band-switching capacitor 32 shown in FIG. 15 are formed in a semiconductor integrated circuit. An n-well 19 formed on a p-type silicon substrate 18 is divided into regions separated by insulator separation layers 20, and a p-type diffusion layer 21 forming the sources and drains of the MOS p-channel transistors $Pch_1$ and $Pch_2$ is formed in these regions. 22 is a gate electrode made of polysilicon.

When two inductors are formed in a semiconductor integrated circuit to make two voltage controlled oscillators as in the conventional example given above, the chip size becomes large and the cost is high.

In addition, with the structure of the band-switching capacitor 32 shown in FIG. 17, a parasitic diode $Di_1$ arises between the p-type diffusion layer 21 serving as the drains of MOS p-channel transistors $Pch_1$ and $Pch_2$ and the n-well 19 connected to $V_{CC}$. On the other hand, $V_{CC}$ is applied via a resistor $R_1$ as a DC bias between the transistor $Pch_1$ and a capacitor $C_1$ and between the transistor $Pch_2$ and the capacitor $C_1$, so that when the band control signal $V_S$ of the band-switching capacitor 32 is "H" and the MOS p-channel transistors $Pch_1$ and $Pch_2$ are OFF, the amplitude of oscillation centered about $V_{CC}$ appears in the drain between $Pch_1$ and $C_1$ and between $Pch_2$ and $C_1$. As a result, if the amplitude of the voltage controlled oscillator 30 becomes greater than approximately 0.7 V, the same signal is applied to the drains of MOS p-channel transistors $Pch_1$ and $Pch_2$ and the parasitic diode $Di_1$ described above is turned ON, causing a state in which the area between $C_1$ is grounded via the parasitic diode $Di_1$ to $V_{CC}$. As a result, even if the band control signal $V_S$ of band-switching capacitor 32 is switched, the oscillation frequency of the voltage controlled oscillator 30 may not vary adequately or adequate amplitude of oscillation is not obtained, so that the phase noise characteristics may deteriorate.

SUMMARY OF THE INVENTION

It is thus an object of the present invention to provide an LC-resonant voltage controlled oscillator apparatus with broadband oscillation frequencies while avoiding deterioration of the phase noise characteristics and enlarged chip sizes.

The voltage controlled oscillator apparatus according to the present invention comprises at least two voltage controlled oscillators, each of the voltage controlled oscillators being formed on a semiconductor substrate and having an LC-resonant circuit including a three-terminal inductor or a two-terminal inductor, and a continuously variable capacitor, and an amplifier including n-channel transistors or n-channel transistors and p-channel transistors. The apparatus is characterized in that two of the three-terminal or two-terminal inductors constructing the first and second voltage controlled oscillators have a coil shape formed with a wiring layer of an integrated circuit formed on the semiconductor substrate, and one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape.

DESCRIPTION OF THE PREFERRED EMBODIMENTS

Figure 1:
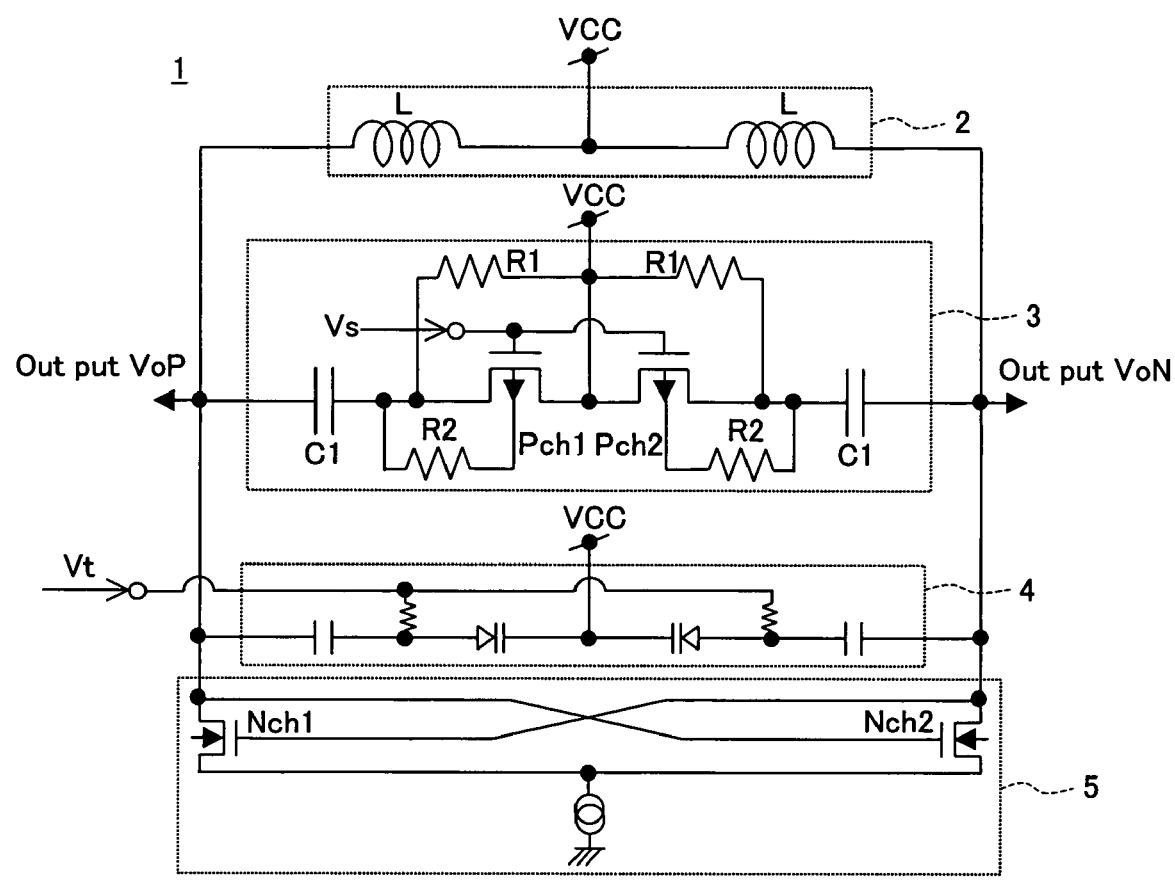
FIG. 1 is a circuit diagram of the voltage controlled oscillator of Embodiment 1.

With a voltage controlled oscillator apparatus according to the present invention having the construction described above, regions for the three-terminal or two-terminal inductors are not separated from each other but disposed in a common region upon the plane of a semiconductor integrated circuit, so that it is possible to achieve broadband in oscillation frequencies while avoiding deterioration of phase noise characteristics and enlarged chip sizes.

In the voltage controlled oscillator apparatus according to the present invention, the two three-terminal or two-terminal inductors can be formed from the same wiring layer. It is preferable that the two three-terminal or two-terminal inductors are disposed such that the centers of their respective planar shapes coincide. The two three-terminal or two-terminal inductors also may be formed in different wiring layers. A construction containing three or more of these voltage controlled oscillators can also be used.

Further, another wiring layer may be interposed between the wiring layers forming the two three-terminal or two-terminal inductors constructing the first or second voltage controlled oscillators. This other wiring layer may form a shield pattern that has at least the same surface area as the three-terminal or two-terminal inductors and has a slit, with the shield pattern being connected to an AC ground point. Further, a selector may be connected to the intermediate point of the three-terminal inductor, giving a construction wherein the selector can be used to select between a connection to the $V_{CC}$ terminal and an open state.

Further, in the basic construction of the voltage controlled oscillator apparatus according to the present invention described above, the following construction can also be adopted.

The LC-resonant circuit described above may have a further band-switching capacitor, and this band-switching capacitor is provided with a pair of capacitors, each with one electrode connected to one of a pair of output terminals of the voltage controlled oscillator, and a pair of MOS p-channel transistors connected between this pair of capacitors. The sources of this pair of MOS p-channel transistors are connected to $V_{CC}$ and their drains are connected to the other electrodes of the pair of capacitors, while resistors $R_1$ are connected between the sources and the drains of the pair of MOS p-channel transistors, and resistors $R_2$ are connected between the drains and n-wells forming the pair of MOS p-channel transistors, and as band control signals, "H" or "L" is applied to the gate of each of the pair of MOS p-channel transistors.

Further, the LC-resonant circuit described above may have a further band-switching capacitor, and this band-switching capacitor is provided with a pair of capacitors, each with one electrode connected to one of a pair of output terminals of the voltage controlled oscillator, and a pair of MOS p-channel transistors connected between this pair of capacitors. The sources of this pair of MOS p-channel transistors are connected to $V_{CC}$ and their drains are connected to the other electrodes of the pair of capacitors, while resistors $R_2$ are connected between the drains and n-wells forming the pair of MOS p-channel transistors, and as band control signals, "L" (=GND) or the minimum drop in voltage that will turn the MOS p-channel transistors "ON" is applied to the gate of each of the pair of MOS p-channel transistors, and at this minimum drop in voltage that turns them "ON" the pair of MOS p-channel transistors are effectively equivalent to high resistance.

Also, the LC-resonant circuit described above may have a further band-switching capacitor, and this band-switching capacitor is provided with a pair of capacitors, each with one electrode connected to one of a pair of output terminals of the voltage controlled oscillator, and a pair of MOS n-channel transistors connected between this pair of capacitors. The sources of this pair of MOS n-channel transistors are connected to GND and their drains are connected to the other electrodes of the pair of capacitors, while resistors $R_1$ are connected between the sources and the drains of the pair of MOS n-channel transistors, and resistors $R_2$ are connected between the drains and p-wells forming the pair of MOS p-channel transistors, and as band control signals, "H" or "L" is applied to the gate of each of the pair of MOS n-channel transistors.

Also, the LC-resonant circuit described above may have a further band-switching capacitor, and this band-switching capacitor is provided with a pair of capacitors, each with one electrode connected to one of a pair of output terminals of the voltage controlled oscillator, and a pair of MOS n-channel transistors connected between this pair of capacitors. The sources of this pair of MOS n-channel transistors are connected to GND and their drains are connected to the other electrodes of the pair of capacitors, while resistors $R_2$ are connected between the drains and p-wells forming the pair of MOS n-channel transistors, and as band control signals, "H" ($=V_{CC}$) or the minimum rise in voltage that will turn the MOS p-channel transistors "ON" is applied to the gate of each of the pair of MOS n-channel transistors, and at this minimum rise in voltage that turns them "ON," the pair of MOS n-channel transistors are effectively equivalent to high resistance.

The following is a more detailed description of the voltage controlled oscillator apparatus in embodiments of the present invention, with reference to the drawings.

Embodiment 1

Figure 2:
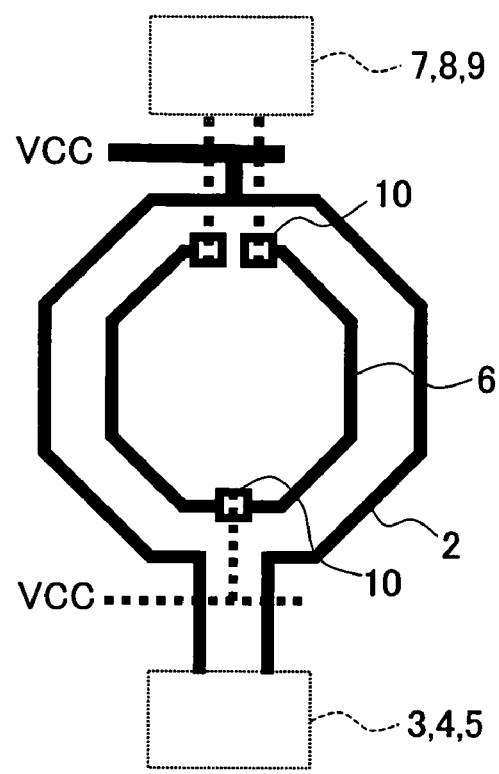
FIG. 2 is a plan view of an inductor constructing the same voltage controlled oscillator.

The following is a description of the voltage controlled oscillator apparatus according to Embodiment 1 with reference to FIGS. 1 and 2. The voltage controlled oscillator apparatus of this embodiment is provided with first and second voltage controlled oscillators. FIG. 1 is a circuit diagram of the first voltage controlled oscillator 1. The second voltage controlled oscillator has fundamentally the same structure as that of FIG. 1 and so an illustration thereof is omitted. In addition, the construction of the voltage controlled oscillator 1 shown in FIG. 1 is basically the same as that shown in FIG. 15, with the three-terminal inductor 2, band-switching capacitor 3, continuously variable capacitor 4 and n-channel transistors 5 corresponding to the three-terminal inductor 31, band-switching capacitor 32, continuously variable capacitor 33 and n-channel transistors 34, respectively, in FIG. 15. Only the construction of the band-switching capacitor 3 differs from the construction of the band-switching capacitor 32 of FIG. 15, and this will be described in the following.

The structures of the three-terminal inductors 2 constructing the first and second voltage controlled oscillators differ from each other. FIG. 2 is a plan view of the first and second three-terminal inductors 2 and 6 used in the constructions of the first and second voltage controlled oscillators. This embodiment is characterized by the structure of these first and second three-terminal inductors 2 and 6. The first and second three-terminal inductors 2 and 6 are both formed with the same wiring layer of the semiconductor integrated circuit, with the center-tapped terminals of each inductor connected to $V_{CC}$. The remaining two terminals are led out to opposite sides with respect to the plane of the inductor region, each being connected to the other circuit elements of the first and second voltage controlled oscillators, respectively. To wit, the remaining two terminals of the first three-terminal inductor 2 are connected to the band-switching capacitor 3, continuously variable capacitor 4 and n-channel transistors 5 of the first voltage controlled oscillator (see FIG. 1). The remaining two terminals of the second three-terminal inductor 6 are connected to the band-switching capacitor 7, continuously variable capacitor 8 and n-channel transistors 9 of the second voltage controlled oscillator.

In FIG. 2, the inductor portions are formed in the wiring layer different from the wiring layer of the lead-out portions for the three terminals, and the two wiring layers are electrically connected by interlayer contacts 10. The parasitic capacitance and sheet resistance of the wiring may greatly affect the self-resonant frequency (SRF) and Q (quality factor) of the respective inductors, so that the wiring layer used for the inductor portions and the wiring layer used for the lead-out portions for the three terminals are selected in consideration thereof.

With the construction according to this embodiment, by disposing two three-terminal inductors without separating the regions for them into two areas in a plane structure of the semiconductor integrated circuit, it is possible to implement a broadband voltage controlled oscillator apparatus while avoiding deterioration of the phase noise characteristics and an enlarged chip size.

Embodiment 2

Figure 3:
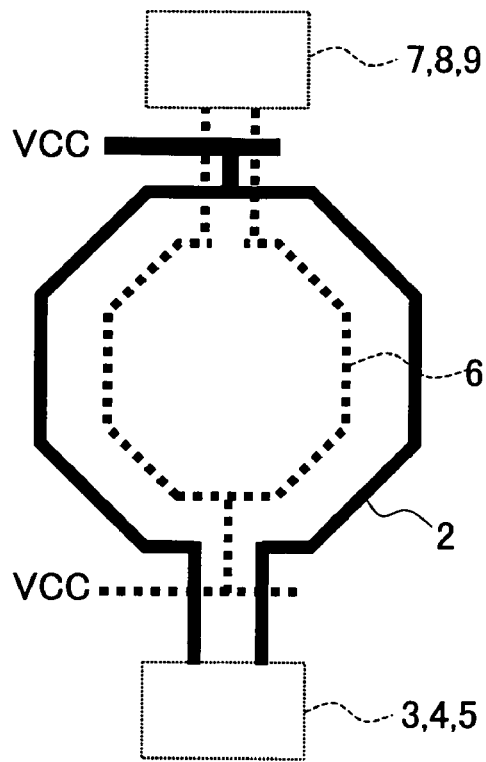
FIG. 3 is a plan view of an inductor constructing the voltage controlled oscillator of Embodiment 2.

FIG. 3 is a plan view showing the structure of the three-terminal inductors constructing the voltage controlled oscillators of Embodiment 2. The planar shapes of the first and second three-terminal inductors 2 and 6 are nearly identical to those in Embodiment 1, but each of the two different wiring layers is allocated exclusively. For this reason, in the vertical structure, the first three-terminal inductor 2 and the three-terminal inductor 6 are separated vertically, so that there is no need for the interlayer contacts 10 (see FIG. 2) that electrically connect the two wiring layers. Typically, when the Si substrate of a semiconductor integrated circuit is set at the GND potential, the wiring layer on the side closest to the Si substrate has an increased parasitic capacitance with respect to the Si substrate at the GND potential, and its self-resonant frequency is decreased. For this reason, among the first voltage controlled oscillator and the second voltage controlled oscillator, the three-terminal inductor of the one with the lower oscillation frequency is formed in the wiring layer that is closer to the Si substrate.

Embodiment 3

Figure 4:
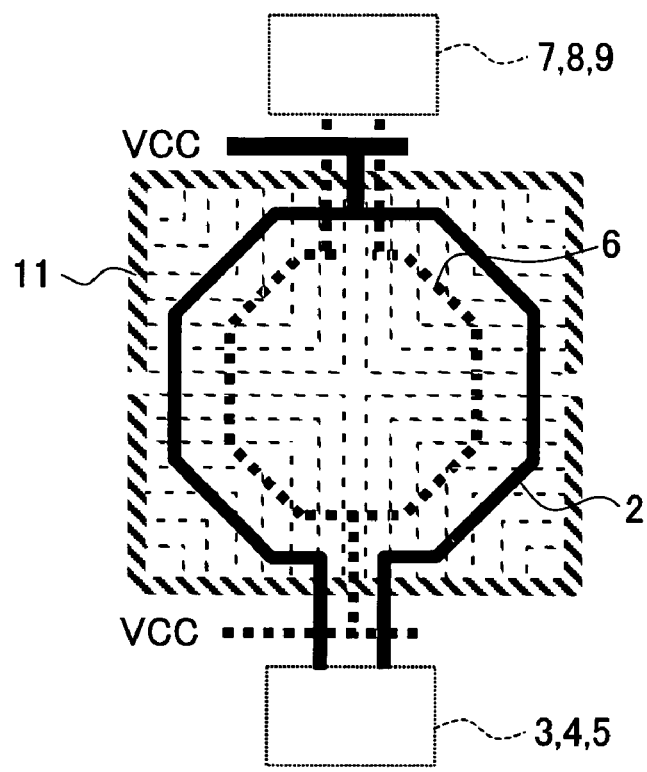
FIG. 4 is a plan view of an inductor constructing the voltage controlled oscillator of Embodiment 3.

FIG. 4 is a plan view showing the structure of the three-terminal inductors constructing the voltage controlled oscillators of Embodiment 3. In the same manner as in Embodiment 2, each of the two different wiring layers is allocated exclusively to one of the first and second three-terminal inductors 2 and 6. The difference from Embodiment 2 lies in that, in the vertical structure, one more wiring layer is interposed between the wiring layers used for the first three-terminal inductor 2 and second three-terminal inductor 6. This interposed wiring layer forms a shield pattern 11 that is connected to GND or $V_{CC}$. The shield pattern 11 has an area substantially the same as the area of the three-terminal inductors 2 and 6 and is provided with a plurality of slits.

Thereby, the first three-terminal inductor 2 and second three-terminal inductor 6 which are separated vertically in the vertical structure are also separated by the shield pattern 11, thus preventing any decrease in Q due to magnetic coupling of the first three-terminal inductor 2 and the second three-terminal inductor 6.

Embodiment 4

Figure 5:
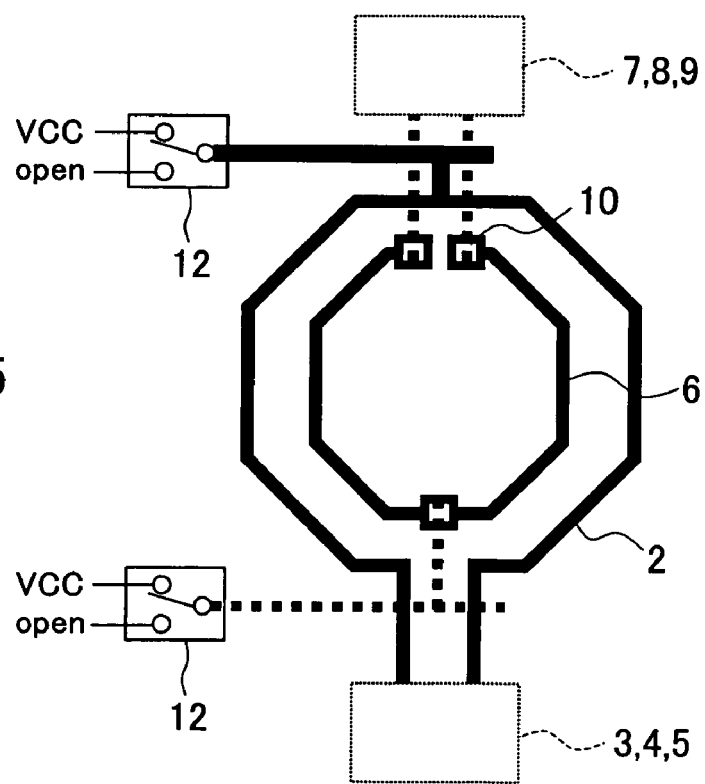
FIG. 5 is a plan view of an inductor constructing the voltage controlled oscillator of Embodiment 4.

FIG. 5 is a plan view showing the structure of the three-terminal inductors constructing the voltage controlled oscillators of Embodiment 4. The structures of the first and second three-terminal inductors 2 and 6 are identical to those of Embodiment 1. The difference lies in that selectors 12 are added to the $V_{CC}$ terminals of the first three-terminal inductor 2 and the second three-terminal inductor 6. When the first voltage controlled oscillator or the second voltage controlled oscillator are not used, their respective selectors 12 can be moved to the "open" position. It is thus possible to avoid current flowing from the inductor through the $V_{CC}$ terminal due to magnetic coupling of the first three-terminal inductor 2 and the three-terminal inductor 6, thereby preventing a decrease in Q.

Embodiment 5

Figure 6:
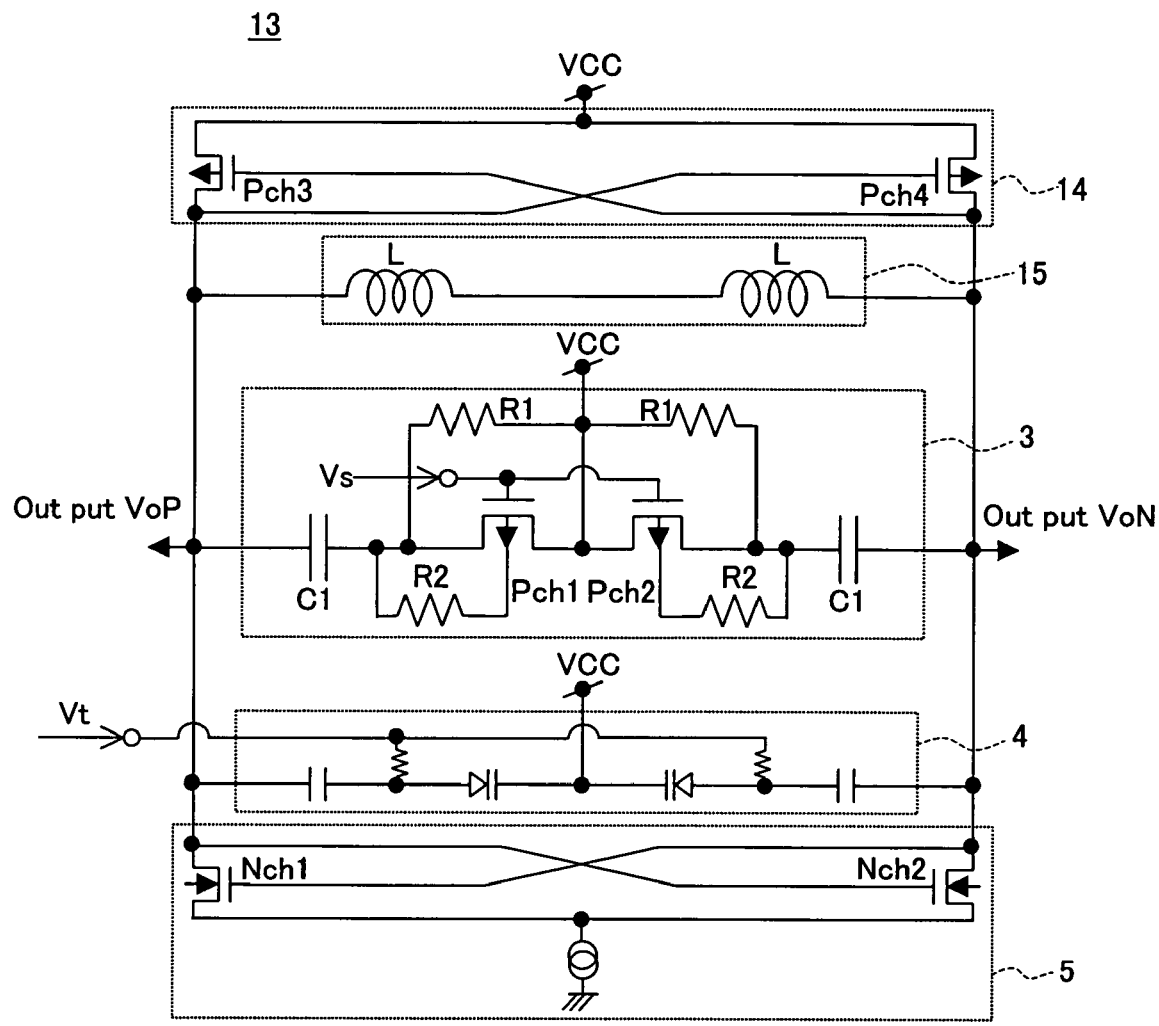
FIG. 6 is a circuit diagram of the voltage controlled oscillator of Embodiment 5.

FIG. 6 is a circuit diagram of the first voltage controlled oscillator 13 of Embodiment 5. The second voltage controlled oscillator has essentially the same structure as that of FIG. 6 and so an illustration thereof is omitted. This first voltage controlled oscillator 13 differs from the first voltage controlled oscillator 1 shown in FIG. 1 in that a p-channel transistor 14 is added and the three-terminal inductor is replaced with a two-terminal inductor 15.

Figure 7:
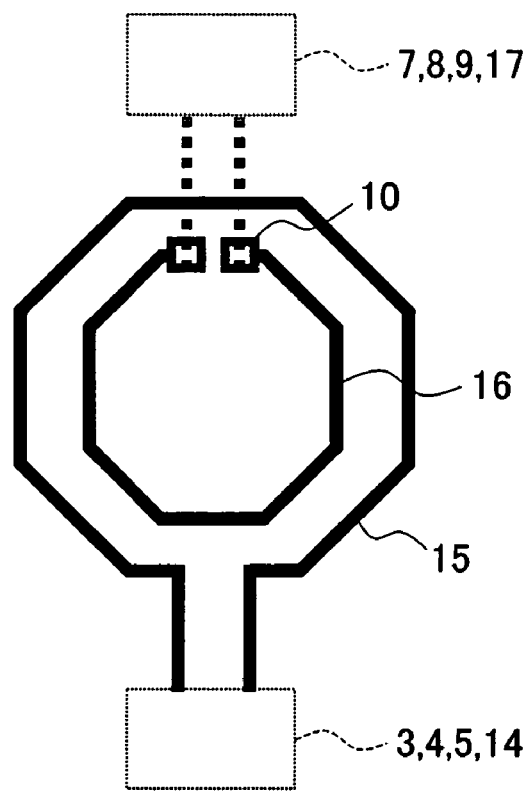
FIG. 7 is a plan view of an inductor constructing the same voltage controlled oscillator.

By adding the p-channel transistor 14, the $V_{CC}$ terminal for supplying current to the n-channel transistors 5 need not be connected to the inductor, as is required in Embodiment 1. The two-terminal inductor 15 is used for this purpose. FIG. 7 is a plan view of the two-terminal inductors 15 and 16 constructing the first voltage controlled oscillator 13 and the second voltage controlled oscillator. Both ends of two-terminal inductor 15 are connected to the band-switching capacitor 3, continuously variable capacitor 4, n-channel transistors 5 and p-channel transistor 14 of the first voltage controlled oscillator. Both ends of two-terminal inductor 16 are connected to the band-switching capacitor 7, continuously variable capacitor 8, n-channel transistors 9 and p-channel transistor 17 of the second voltage controlled oscillator.

Figure 8:
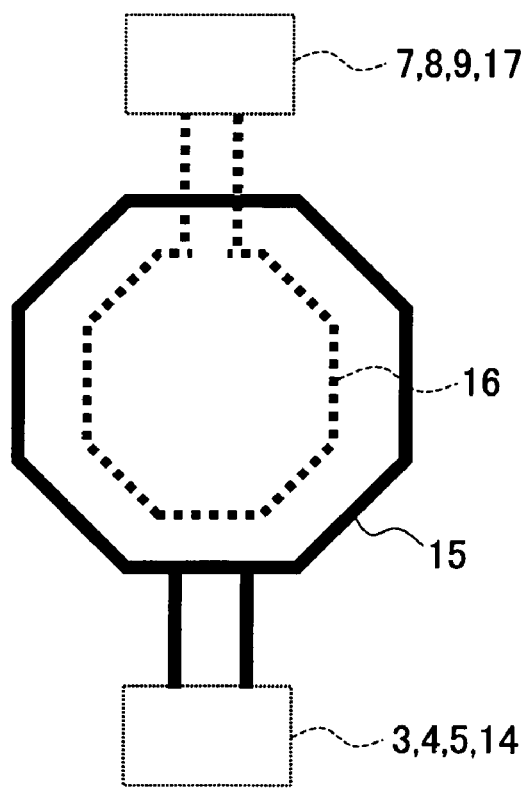
FIG. 8 is a plan view of a modification of the inductor constructing the same voltage controlled oscillator.

The two-terminal inductors 15 and 16 shown in FIG. 7 have inductor portions made of the same wiring layer, but they also may be made of different wiring layers as in the embodiment shown in FIG. 3. FIG. 8 illustrates the planar structure of the two-terminal inductors 15 and 16 in that case.

Embodiment 6

Figure 9:
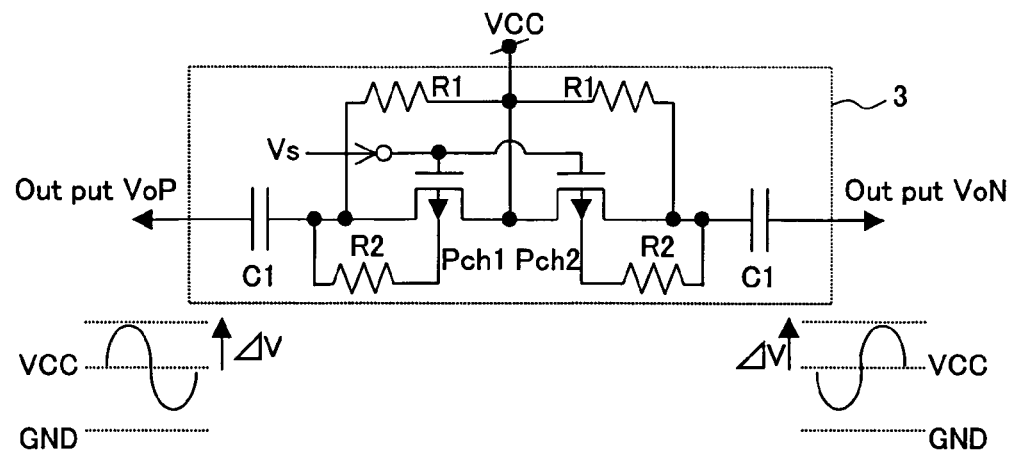
FIG. 9 is a circuit diagram of a band-switching capacitor constructing the voltage controlled oscillator of Embodiment 6.
Figure 10:
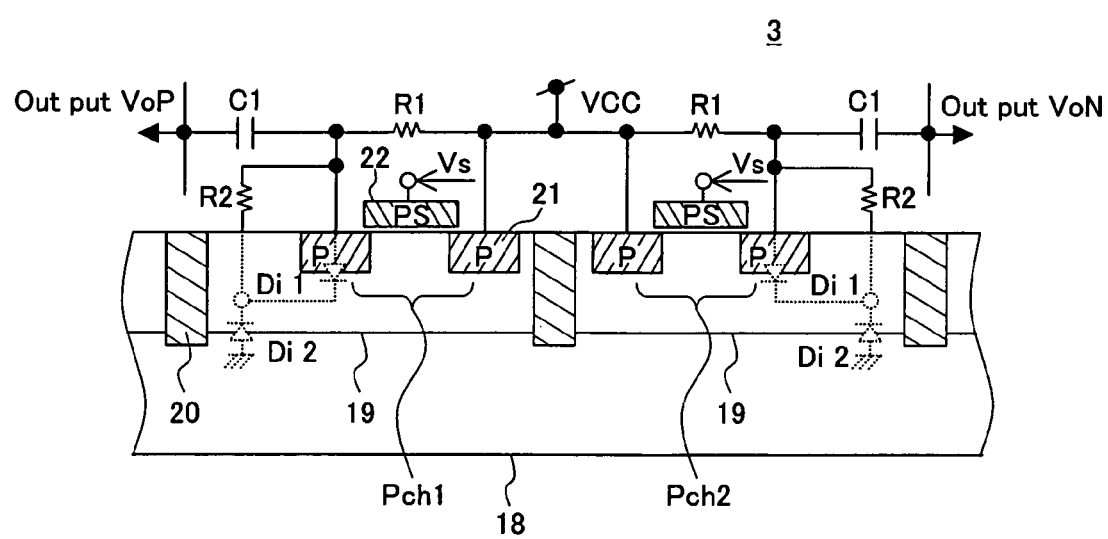
FIG. 10 is a diagram of the vertical structure of the same band-switching capacitor.

FIG. 9 is a circuit diagram of a band-switching capacitor 3 constructing the voltage controlled oscillator of Embodiment 6. The circuit structure of this band-switching capacitor 3 is identical to the circuit shown in FIG. 1. FIG. 10 shows the vertical structure of band-switching capacitor 3.

Figure 15:
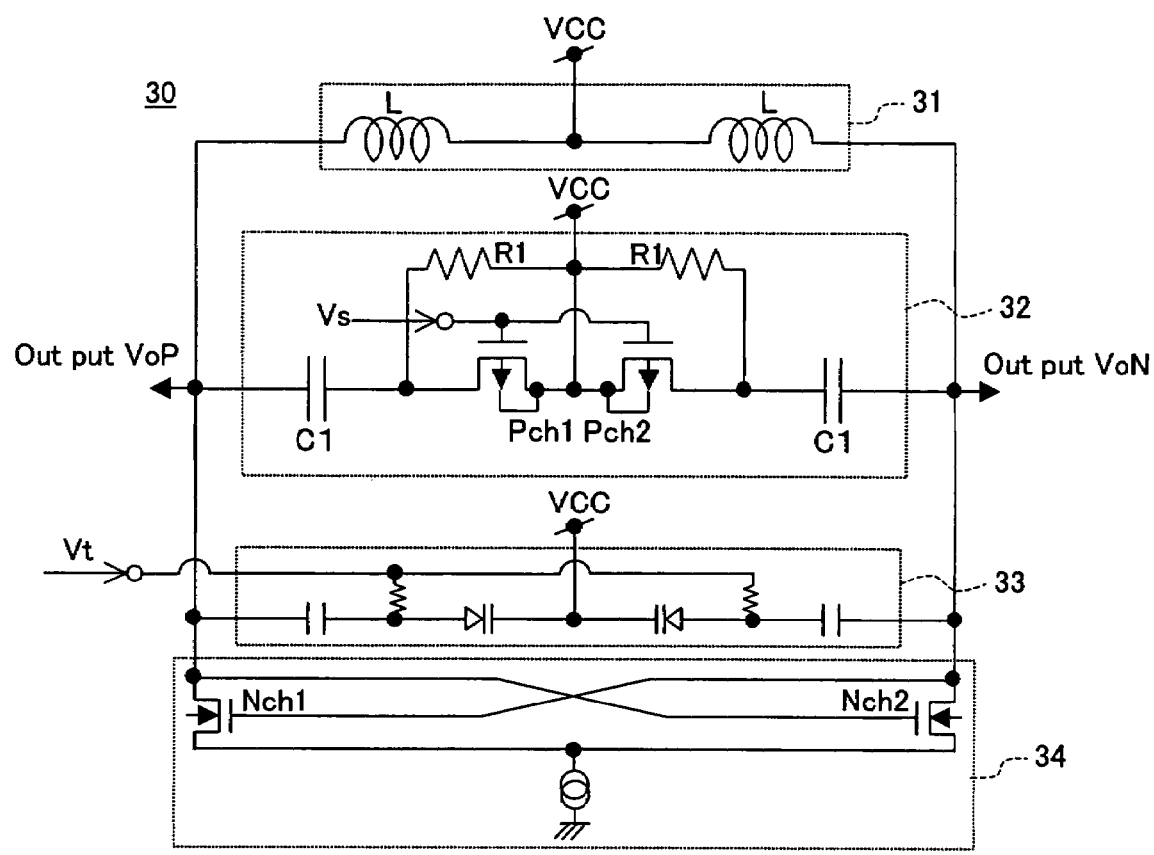
FIG. 15 is a circuit diagram of a conventional voltage controlled oscillator.
Figure 16:
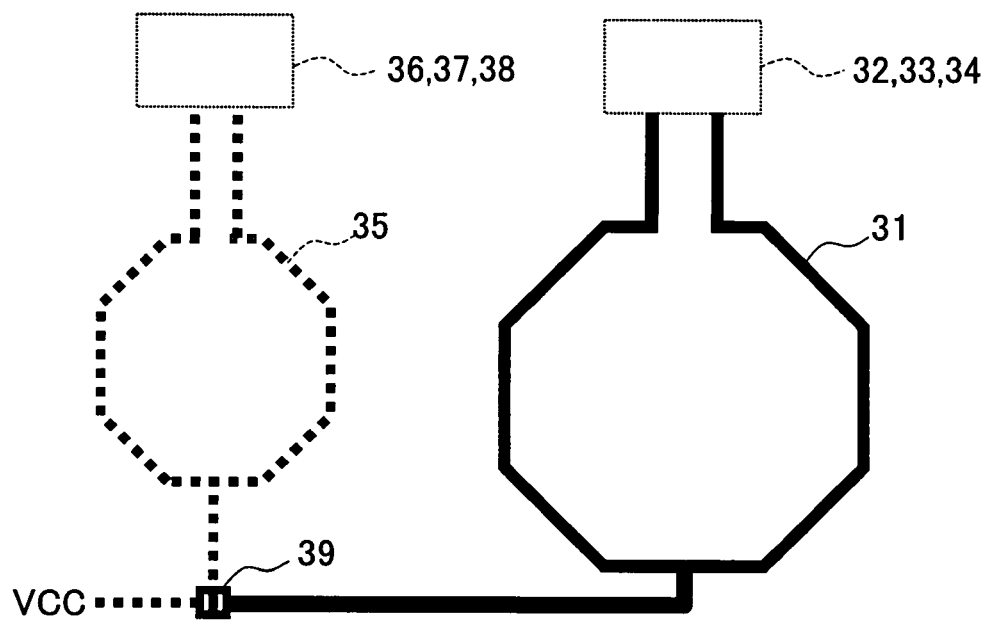
FIG. 16 is a plan view of conventional inductor.
Figure 17:
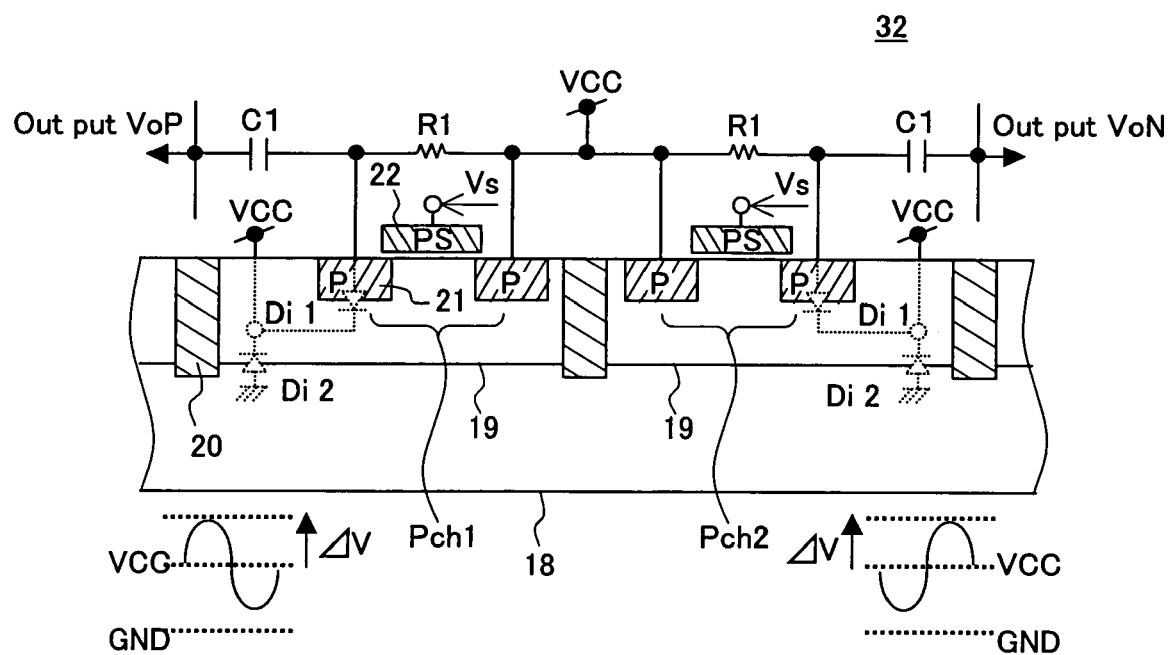
FIG. 17 is a diagram of the vertical structure of a band-switching capacitor constructing a conventional voltage controlled oscillator.

This band-switching capacitor 3 differs from the conventional construction shown in FIGS. 15 and 17 on the following points: In the band-switching capacitor 3 of the embodiment shown in FIGS. 9 and 10, the n-wells 19 of the MOS p-channel transistors $Pch_1$ and $Pch_2$ are connected via resistors $R_2$ to the drains of $Pch_1$ and $Pch_2$, respectively. As a result, the MOS p-channel transistors $Pch_1$ and $Pch_2$ are turned OFF when the band control signal $V_S$ of band-switching capacitor 3 is "H," and even in the event that the drains of the MOS p-channel transistors $Pch_1$ and $Pch_2$ exceed $V_{CC}$ due to the amplitude of oscillation, the parasitic diodes $Di_1$ described above will not turn ON.

On the other hand, when the n-wells 19 are connected directly to the drains of $Pch_1$ and $Pch_2$, respectively, this is equivalent to AC grounding of $C_1$ through capacitance due to the reverse biasing of the parasitic diodes $Di_2$ formed between the p-type Si substrate (GND potential) and the n-wells 19. For this reason, there is a possibility that a sufficiently broad range of oscillation frequencies will not be obtained from the voltage controlled oscillator. In order to counter this, in this embodiment, by connecting the n-wells 19 of the MOS p-channel transistors $Pch_1$ and $Pch_2$ via resistors $R_2$ to the drains of $Pch_1$ and $Pch_2$, respectively, it is possible to avoid the parasitic diodes $Di_1$ from turning ON without deterioration of the phase noise characteristics, obtaining a sufficiently broad range of oscillation frequencies of the voltage controlled oscillator.

Embodiment 7

Figure 11:
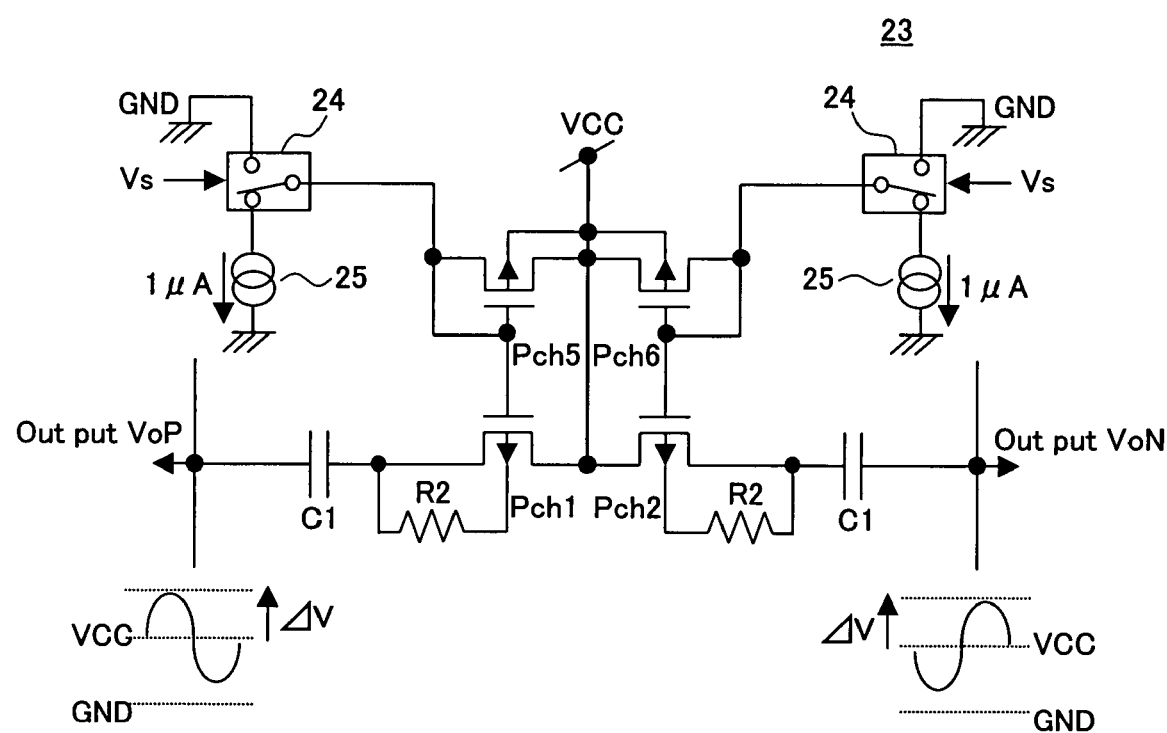
FIG. 11 is a circuit diagram of a band-switching capacitor constructing the voltage controlled oscillator of Embodiment 7.

FIG. 11 is a circuit diagram of a band-switching capacitor 23 constructing the voltage controlled oscillator of Embodiment 7. The construction of this band-switching capacitor 23 is characterized by the following. With the band-switching capacitor 3 illustrated in FIGS. 9 and 10, depending on whether the band control signal $V_S$ is "L" or "H," the MOS p-channel transistors $Pch_1$ and $Pch_2$ are turned "ON" or "OFF," thus switching the band-switching capacitor 3 by the amount $C_1$. In contrast, the band-switching capacitor 23 of this embodiment shown in FIG. 11 has MOS p-channel transistors $Pch_5$ and $Pch_6$, a selector 24 and a bias current supply 25, so that a construction is adopted wherein the transistors $Pch_1$ and $Pch_2$ that form a current mirror are controlled by controlling the transistors $Pch_5$ and $Pch_6$ by means of the band control signal $V_S$ input to the selector 24.

When the capacitance value of the band-switching capacitor 23 is to be increased, the MOS p-channel transistors $Pch_1$ and $Pch_2$ are turned "ON". By setting the gate voltage to "L" (=GND) at this time, this is identical to the band-switching capacitor 3 shown in FIGS. 9 and 10, so that the MOS p-channel transistors $Pch_1$ and $Pch_2$ are effectively equivalent to low resistance (~0 Ω).

When the capacitance value of the band-switching capacitor 23 is to be decreased, the MOS p-channel transistors $Pch_1$ and $Pch_2$ are not turned completely "OFF". To do this, the transistors $Pch_1$ and $Pch_2$ similarly are controlled by controlling the transistors $Pch_5$ and $Pch_6$ by means of the band control signal $V_S$ input to selector 24. Thus, operation is possible wherein the gate voltage does not drop to "L" (=GND), but rather its decrease is limited to roughly the lower limit at which the MOS p-channel transistors $Pch_1$ and $Pch_2$ can turn "ON" (typically $\sim V_{CC}$–0.5 V).

As a result, the MOS p-channel transistors $Pch_1$ and $Pch_2$ become effectively equivalent to high resistance (~several kΩ to several tens of kΩ). Thus, the same effect as when the MOS p-channel transistors $Pch_1$ and $Pch_2$ are turned "OFF" is obtained, and the capacitance of the band-switching capacitor 23 is decreased. In addition, the MOS p-channel transistors $Pch_1$ and $Pch_2$ are effectively equivalent to high resistance (~several kΩ to several tens of kΩ), so that the DC bias of their drains becomes $V_{CC}$.

Thus, the resistor $R_1$, which had been necessary in the band-switching capacitor 3 shown in FIGS. 9 and 10, becomes unnecessary. As a result, the noise that had been caused by $R_1$ is eliminated, so that this is effective in reducing the phase noise of the voltage controlled oscillator.

Embodiment 8

Figure 12:
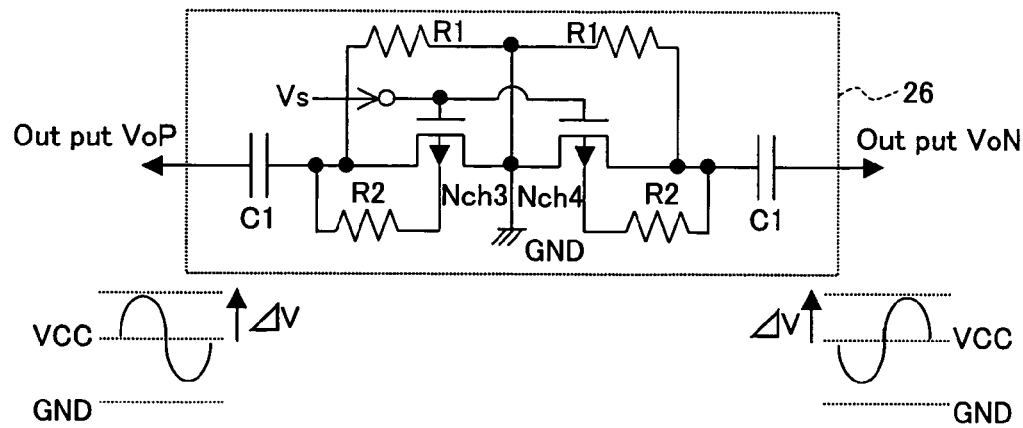
FIG. 12 is a circuit diagram of a band-switching capacitor constructing the voltage controlled oscillator of Embodiment 8.
Figure 13:
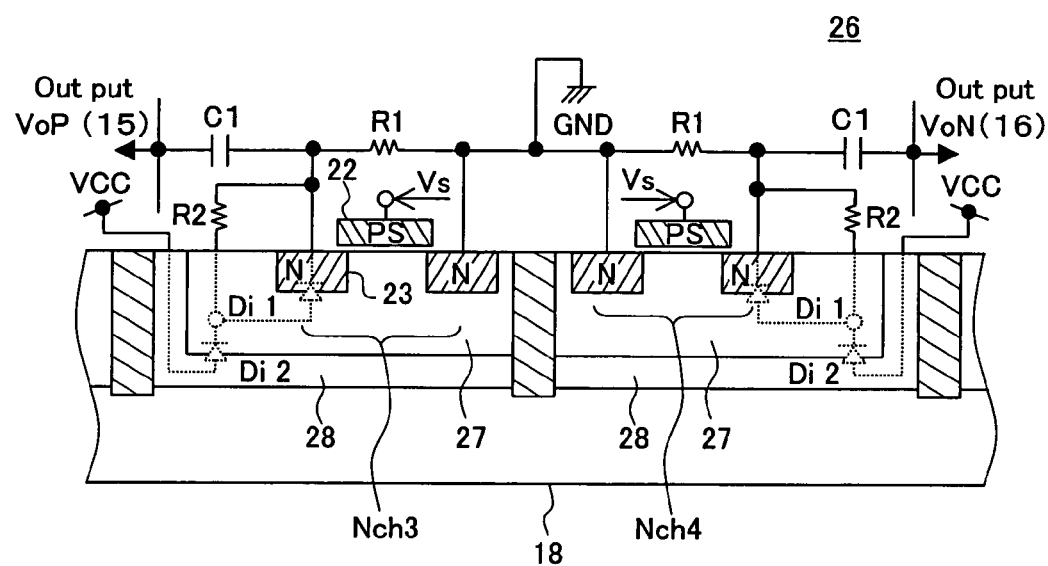
FIG. 13 is a diagram of the vertical structure of the same band-switching capacitor.

FIG. 12 is a circuit diagram of a band-switching capacitor 26 constructing the voltage controlled oscillator of Embodiment 8. FIG. 13 shows the vertical structure of this band-switching capacitor 26. The band-switching capacitor 26 differs from the band-switching capacitor 3 shown in FIGS. 9 and 10 in that the MOS p-channel transistors $Pch_1$ and $Pch_2$ are replaced with MOS n-channel transistors $Nch_3$ and $Nch_4$. Accordingly, the MOS n-channel transistors $Nch_3$ and $Nch_4$ and resistors $R_1$ are connected so that their DC bias becomes GND.

Its principle of operation and effect are completely identical to those of the embodiment shown in FIGS. 9 and 10, but because MOS n-channel transistors are used, as illustrated by the vertical structure of FIG. 13, the band-switching capacitor 26 of this embodiment does not have the twin-well structure (p-wells 27, n-wells 19) used in ordinary CMOS processes, but rather a triple-well structure (p-wells 27, n-wells 19 plus n-wells 28) is required.

The p-wells 27 of the MOS n-channel transistors $Nch_3$ and $Nch_4$ are connected via resistors $R_2$ to the drains of $Nch_3$ and $Nch_4$, respectively. As a result, the MOS n-channel transistors $Nch_3$ and $Nch_4$ are turned OFF when the band control signal $V_S$ of the band-switching capacitor 26 is "L," and even in the event that the drains of the MOS n-channel transistors $Nch_3$ and $Nch_4$ drop below GND due to the amplitude of oscillation, the parasitic diodes $Di_1$ are not turned ON. The effect of the resistors $R_2$ is also the same as in the band-switching capacitor 3 shown in FIGS. 9 and 10. That is to say, it is possible to prevent problems such as in the case when the parasitic diodes $Di_2$ are directly connected to the drains of $Nch_3$ and $Nch_4$, where this is equivalent to AC grounding of $C_1$ through capacitance due to the parasitic diode $Di_2$ being reverse biased, so that a sufficiently broad range of oscillation frequencies will not be obtained from the voltage controlled oscillator.

Figure 14:
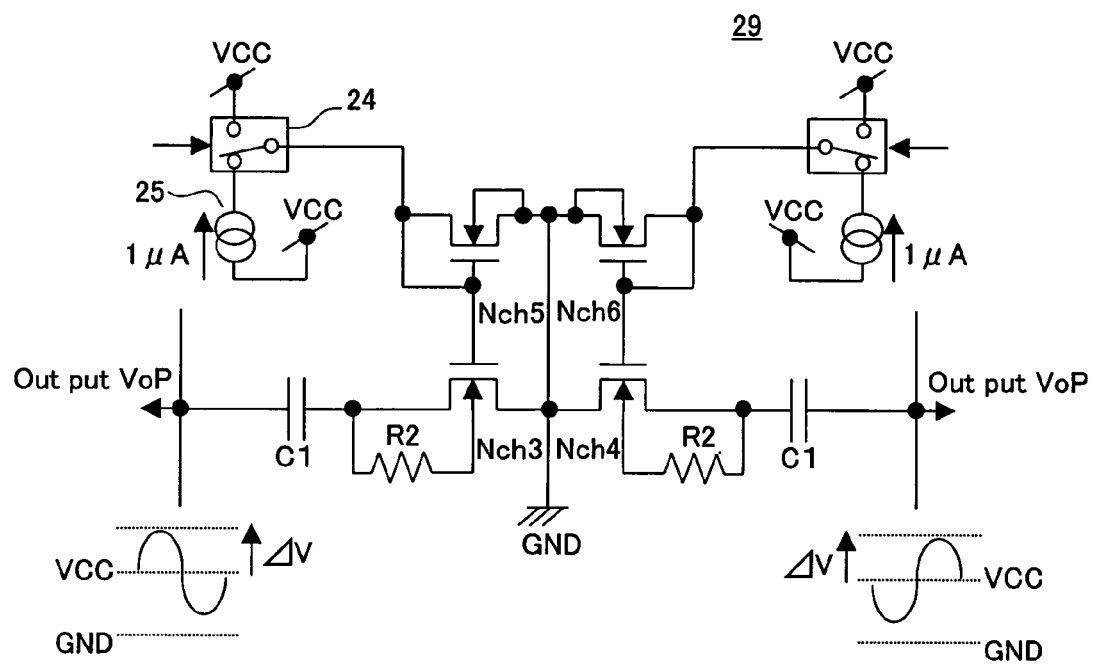
FIG. 14 is a circuit diagram wherein the construction of the same Embodiment is applied to the band-switching capacitor of Embodiment 7.

A construction using MOS n-channel transistors as in this embodiment also may be applied to the construction of the band-switching capacitor 23 shown in FIG. 11. FIG. 14 is a circuit diagram of a band-switching capacitor 29 thus constructed. In comparison to the band-switching capacitor 23 shown in FIG. 11, except for the MOS p-channel transistors $Pch_1$, $Pch_2$, $Pch_5$ and $Pch_6$ being changed to MOS n-channel transistors $Nch_3$, $Nch_4$, $Nch_5$ and $Nch_6$, its principle of operation and effect are the same as those of the embodiment shown in FIG. 11.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A voltage controlled oscillator apparatus comprising at least two voltage controlled oscillators, each of the voltage controlled oscillators being formed on a semiconductor substrate and comprising:
   an LC-resonant circuit including:
      a three-terminal inductor; and
      a continuously variable capacitor; and
   an amplifier including n-channel transistors or n-channel transistors and p-channel transistors;
   wherein
   1) two of the three-terminal inductors constructing the first and second voltage controlled oscillators have a coil shape formed with a wiring layer of an integrated circuit formed on the semiconductor substrate, and
   2) one of the three-terminal inductors has such a shape that its inductance value differs from that of the other of the three-terminal inductors, and is disposed in a region inside of the other of the three-terminal inductors with respect to its planar shape.

2. The voltage controlled oscillator apparatus according to claim 1, wherein the two three-terminal inductors or two-terminal inductors are disposed such that their centers with respect to their planar shapes coincide.

3. The voltage controlled oscillator apparatus according to claim 1, wherein the two three-terminal inductors or two-terminal inductors are formed from different wiring layers.

4. The voltage controlled oscillator apparatus according to claim 1, comprising at least three of the voltage controlled oscillators.

5. A voltage controlled oscillator apparatus, comprising at least two voltage controlled oscillators, each of the voltage controlled oscillators being formed on a semiconductor substrate and comprising:
   an LC-resonant circuit including:
      a three-terminal inductor or a two-terminal inductor; and
      a continuously variable capacitor; and
   an amplifier including n-channel transistors or n-channel transistors and p-channel transistors;
   wherein
   1) two of the three-terminal or two-terminal inductors constructing the first and second voltage controlled oscillators have a coil shape formed with a wiring layer of an integrated circuit formed on the semiconductor substrate,
   2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape, and
   3) the two three-terminal inductors or two-terminal inductors are formed from the same wiring layer.

6. The voltage controlled oscillator apparatus according to claim 5, wherein the two three-terminal inductors or two-terminal inductors are disposed such that their centers with respect to their planar shapes coincide.

7. The voltage controlled oscillator apparatus according to claim 5, wherein the two three-terminal inductors or two-terminal inductors are formed from different wiring layers.

8. The voltage controlled oscillator apparatus according to claim 5, comprising at least three of the voltage controlled oscillators.

9. A voltage controlled oscillator apparatus, comprising at least two voltage controlled oscillators, each of the voltage controlled oscillators being formed on a semiconductor substrate and comprising:
   an LC-resonant circuit including:
      a three-terminal inductor or a two-terminal inductor; and
      a continuously variable capacitor; and
   an amplifier including n-channel transistors or n-channel transistors and p-channel transistors;
   wherein:
   1) two of the three-terminal or two-terminal inductors constructing the first and second voltage controlled oscillators have a coil shape formed with a wiring layer of an integrated circuit formed on the semiconductor substrate,
   2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape,
   3) the two three-terminal inductors or two-terminal inductors are formed from different wiring layers, and
   4) another wiring layer is interposed between the wiring layers forming the three-terminal or two-terminal inductors constructing the first and second voltage controlled oscillators, the other wiring layer forms a shield pattern that has at least the same surface area as the three-terminal or two-terminal inductors and that has a slit, and the shield pattern is connected to an AC ground point.

10. A voltage controlled oscillator apparatus, comprising at least two voltage controlled oscillators, each of the voltage controlled oscillators being formed on a semiconductor substrate and comprising:
   an LC-resonant circuit including:
   a three-terminal inductor or a two-terminal inductor; and
   a continuously variable capacitor; and
   an amplifier including n-channel transistors or n-channel transistors and p-channel transistors;
   wherein:
   1) two of the three-terminal or two-terminal inductors constructing the first and second voltage controlled oscillators have a coil shape formed with a wiring layer of an integrated circuit formed on the semiconductor substrate, 2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape, and 3) a selector is connected to the intermediate point of the three-terminal inductor and the selector can be used to select between a connection to a $V_{CC}$ terminal and an open state.

11. A voltage controlled oscillator apparatus, comprising at least two voltage controlled oscillators, each of the voltage controlled oscillators being formed on a semiconductor substrate and comprising:

an LC-resonant circuit including:
  a three-terminal inductor or a two-terminal inductor; and
  a continuously variable capacitor; and
an amplifier including n-channel transistors or n-channel transistors and p-channel transistors;
wherein:

1) two of the three-terminal or two-terminal inductors constructing the first and second voltage controlled oscillators have a coil shape formed with a wiring layer of an integrated circuit formed on the semiconductor substrate, 2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape, and 3) the LC-resonant circuit further comprises a band-switching capacitor, the band-switching capacitor comprises a pair of capacitors, each with one electrode connected to one of a pair of output terminals of the voltage controlled oscillator, and a pair of MOS p-channel transistors connected between the pair of capacitors, the source of each of the pair of MOS p-channel transistors is connected to $V_{CC}$, the drain thereof is connected to the other electrode of the pair of capacitors, resistors $R_1$ are connected between the source and the drain of each of the pair of MOS p-channel transistors, and resistors $R_2$ are connected between the drain and an n-well in which the pair of MOS p-channel transistors is formed, and as band control signals, "H" or "L" is applied to the gate of each of the pair of MOS p-channel transistors.

12. A voltage controlled oscillator apparatus, comprising at least two voltage controlled oscillators, each of the voltage controlled oscillators being formed on a semiconductor substrate and comprising:

an LC-resonant circuit including:
  a three-terminal inductor or a two-terminal inductor; and
  a continuously variable capacitor; and
an amplifier including n-channel transistors or n-channel transistors and p-channel transistors;
wherein:

1) two of the three-terminal or two-terminal inductors constructing the first and second voltage controlled oscillators have a coil shape formed with a wiring layer of an integrated circuit formed on the semiconductor substrate, 2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape, and 3) the LC-resonant circuit further comprises a band-switching capacitor, the band-switching capacitor comprises a pair of capacitors, each with one electrode connected to one of a pair of output terminals of the voltage controlled oscillator, and a pair of MOS p-channel transistors connected between the pair of capacitors, the source of each of the pair of MOS p-channel transistors is connected to $V_{CC}$, the drain thereof is connected to the other electrode of the pair of capacitors, and resistors $R_2$ are connected between the drain and an n-well in which the pair of MOS p-channel transistors is formed, and as band control signals, "L" (=GND) or the minimum drop in voltage that will turn the MOS p-channel transistors "ON" is applied to the gate of each of the pair of MOS p-channel transistors, and at this minimum drop in voltage that turns them "ON," the pair of MOS p-channel transistors arc effectively equivalent to high resistance.

13. A voltage controlled oscillator apparatus, comprising at least two voltage controlled oscillators, each of the voltage controlled oscillators being formed on a semiconductor substrate and comprising:

an LC-resonant circuit including:
  a three-terminal inductor or a two-terminal inductor; and
  a continuously variable capacitor; and
an amplifier including n-channel transistors or n-channel transistors and p-channel transistors;
wherein:

1) two of the three-terminal or two-terminal inductors constructing the first and second voltage controlled oscillators have a coil shape formed with a wiring layer of an integrated circuit formed on the semiconductor substrate, 2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape, and 3) the LC-resonant circuit further comprises a band-switching capacitor, the band-switching capacitor comprises a pair of capacitors, each with one electrode connected to one of a pair of output terminals of the voltage controlled oscillator, and a pair of MOS n-channel transistors connected between the pair of capacitors, the source of each of the pair of MOS n-channel transistors is connected to GND, the drain thereof is connected to the other electrode of the pair of capacitors, resistors $R_1$ are connected between the source and the drain of each of the pair of MOS n-channel transistors, and resistors $R_2$ are connected between the drain and a n-well in which the pair of MOS n-channel transistors is formed, and as band control signals, "H" or "L" is applied to the gate of each of the pair of MOS n-channel transistors.

14. A voltage controlled oscillator apparatus, comprising at least two voltage controlled oscillators, each of the voltage controlled oscillators being formed on a semiconductor substrate and comprising:

an LC-resonant circuit including:
  a three-terminal inductor or a two-terminal inductor; and
  a continuously variable capacitor; and an amplifier including n-channel transistors or n-channel transistors and p-channel transistors;
wherein:
1) two of the three-terminal or two-terminal inductors constructing the first and second voltage controlled oscillators have a coil shape formed with a wiring layer of an integrated circuit formed on the semiconductor substrate,
2) one of the three-terminal or two-terminal inductors has such a shape that its inductance value differs from that of the other of the three-terminal or two-terminal inductors, and is disposed in a region inside of the other of the three-terminal or two-terminal inductors with respect to its planar shape, and
3) the LC-resonant circuit further comprises a band-switching capacitor,
the band-switching capacitor comprises a pair of capacitors, each with one electrode connected to one of a pair of output terminals of the voltage controlled oscillator, and a pair of MOS n-channel transistors connected between the pair of capacitors,
the source of each of the pair of MOS n-channel transistors is connected to GND, the drain thereof is connected to the other electrode of the pair of capacitors, and resistors $R_2$ are connected between the drain end a p-well in which the pair of MOS n-channel transistors is formed, and
as band control signals, "H" ($=V_{CC}$)or the minimum rise in voltage that will turn the MOS n-channel transistors "ON" is applied to the gate of each of the pair of MOS n-channel transistors, and at this minimum rise in voltage that turns them "ON," the pair of MOS n-channel transistors are effectively equivalent to high resistance.

* * * * *